United States Patent
Kwon et al.

(10) Patent No.: US 8,433,829 B2
(45) Date of Patent: Apr. 30, 2013

(54) DIRECT MEMORY ACCESS CONTROLLER AND METHOD OF OPERATING THE SAME

(75) Inventors: Ki-Seok Kwon, Seoul (KR); Jae-Un Park, Seoul (KR); Suk-Jin Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/948,516

(22) Filed: Nov. 17, 2010

(65) Prior Publication Data

US 2011/0138086 A1 Jun. 9, 2011

(30) Foreign Application Priority Data

Dec. 3, 2009 (KR) ........................ 10-2009-0119317

(51) Int. Cl.
*G06F 13/28* (2006.01)
(52) U.S. Cl.
USPC ............................................. 710/22; 710/26
(58) Field of Classification Search ............. 710/26, 710/22
See application file for complete search history.

(56) References Cited

U.S. PATENT DOCUMENTS

| | | | |
|---|---|---|---|
| 5,444,497 A | 8/1995 | Takeuchi | |
| 5,546,137 A | 8/1996 | Takeuchi | |
| 5,585,864 A | 12/1996 | Takeuchi | |
| 5,883,670 A * | 3/1999 | Sporer et al. | 375/240.25 |
| 7,934,043 B2 * | 4/2011 | Takeda | 710/309 |

FOREIGN PATENT DOCUMENTS

| | | |
|---|---|---|
| JP | 06-195297 | 7/1994 |
| JP | 06-332843 | 12/1994 |
| JP | 2005-301665 | 10/2005 |
| KR | 10-2001-0087887 | 9/2001 |

\* cited by examiner

*Primary Examiner* — Farley Abad
(74) *Attorney, Agent, or Firm* — NSIP Law

(57) ABSTRACT

Provided is a Direct Memory Access (DMA) controller which provides a function of searching for a specific pattern from data being transmitted during DMA transmission. The DMA controller stores at least one pattern value. The DMA controller compares data being transmitted to a pattern value while transmitting the data using a DMA method, and generates, in response to data matching the pattern value being detected, a signal indicating that the data matching the pattern value has been detected. The DMA controller stores an address of the data matching the pattern value in response to the generated signal.

18 Claims, 6 Drawing Sheets

DIRECT MEMORY ACCESS CONTROLLER AND METHOD OF OPERATING THE SAME

CROSS-REFERENCE TO RELATED APPLICATION

This application claims the benefit under 35 U.S.C. §119(a) of Korean Patent Application No. 10-2009-0119317, filed on Dec. 3, 2009, in the Korean Intellectual Property Office, the entire disclosure of which is incorporated herein by reference for all purposes.

BACKGROUND

1. Field

The following description relates to a direct memory access controller and a method of operating the same.

2. Description of the Related Art

Direct Memory Access (hereinafter, simply referred to as DMA) is generally used in microprocessor systems, integrated microcontrollers, and the like. DMA controllers can be used to transfer data from a memory to peripheral devices or vice versa, independently from a CPU of a computer system. Specifically, a DMA controller is directed to transfer particular data from a source location to a destination location.

A source can be generated, for example, by a data memory of a microcontroller, a memory of a peripheral device or a peripheral device itself (for example, an analog-to-digital converter, a port, etc.), or included in data that is accessible by a peripheral device. Meanwhile, a destination can be included in a memory and accordingly can be transferred at high speed in a memory device of a computer system or a microcontroller. The destination may be a peripheral device, such as digital-to-analog converter, a port, etc. The DMA controller may receive source and destination addresses to transfer data from the source to the destination.

SUMMARY

The following description relates to an apparatus and method which can provide a function of searching for a specific pattern from data being transmitted during DMA transmission, thereby reducing a total operating time of a system that needs to search for the specific pattern.

The foregoing and/or other features and aspects may be achieved by providing a Direct Memory Access (DMA) Controller which transmits data from a first device to a second device without passing through a processor, the DMA controller including a pattern register to store at least one pattern value, a pattern detector to compare data being transmitted through the DMA controller to the pattern value and to generate, in response to data matching the pattern value is being detected from the data being transmitted, a signal indicating that the data matching the pattern value has been detected, and an address register to store an address of the data matching the pattern value in response to the signal generated by the pattern detector.

The DMA controller may further include a controller to control DMA operation, wherein a DMA operation may be performed simultaneously with operation of the pattern detector.

The pattern register may include at least one register to store the at least one pattern value, and a pattern register controller to store a pattern value received from an external device in the at least one register.

The pattern detector may include a pattern detection controller to select a pattern value from the at least one pattern value, and at least one comparator to compare the selected pattern value with the data being transmitted, wherein the pattern detection controller may generate, in response to data matching the selected pattern value being detected from the data being transmitted, a signal indicating that the data matching the pattern value has been detected.

The controller may receive a control signal used in selecting the pattern value from the external device and provide the control signal to the pattern detection controller.

The address register may include an address controller to acquire an address of the data matching the pattern value, in response to the signal received from the pattern detector, the signal indicating that the data matching the pattern value has been detected, and at least one register to store the acquired address.

The address register may further include a multiplexer to selectively output an address of data stored in the at least one register to an external device, in response to a request from the external device, regardless of data transmission by DMA.

The external device may be a processor.

The data being transmitted may be video data and the pattern value may be information used in identifying a boundary of a frame from the video data.

The foregoing and/or other features and aspects may also be achieved by providing a method of operating a DMA controller to transfer data from a first device to a second device without passing through a processor, the method including transmitting data through the DMA controller, searching for a pattern value in the data being transmitted while transferring the data, and storing an address of data matching the pattern value.

The searching of the pattern value from the data being transmitted may include comparing the data being transmitted through the DMA controller to the pattern value, and generating, in response to data matching the pattern value being detected from the data being transmitted, a signal indicating that the data matching the pattern value has been detected, wherein the storing of the address of the data matching the pattern value may include storing an address of the data matching the pattern value in response to the signal indicating that the data matching the pattern value has been detected.

The method may further include, before the comparing of the data being transmitted to the pattern value, storing the at least one pattern value, and selecting a pattern value from the at least one pattern value to be compared.

The storing of the address of the data matching the pattern value may include acquiring the address of the data being transmitted in response to the signal indicating that the data matching the pattern value has been detected, and storing the acquired address.

The method may further include selectively outputting the stored address to the external device, in response to a request from the external device, regardless of data transmission by DMA.

The data being transmitted may be video data and the pattern value may be information used in identifying a boundary of a frame from the video data.

The foregoing and/or other features and aspects may also be achieved by providing a method of operating a DMA controller to transfer data from a first device to a second device without passing through a processor, the method including detecting a predetermined pattern in the transferred data, and storing an address of data matching the pattern.

Other features and aspects will be apparent from the following detailed description, the drawings, and the claims.

BRIEF DESCRIPTION OF THE DRAWINGS

These and/or other aspects will become apparent and more readily appreciated from the following description of various example embodiments, taken in conjunction with the accompanying drawings briefly described below.

Figure 1:
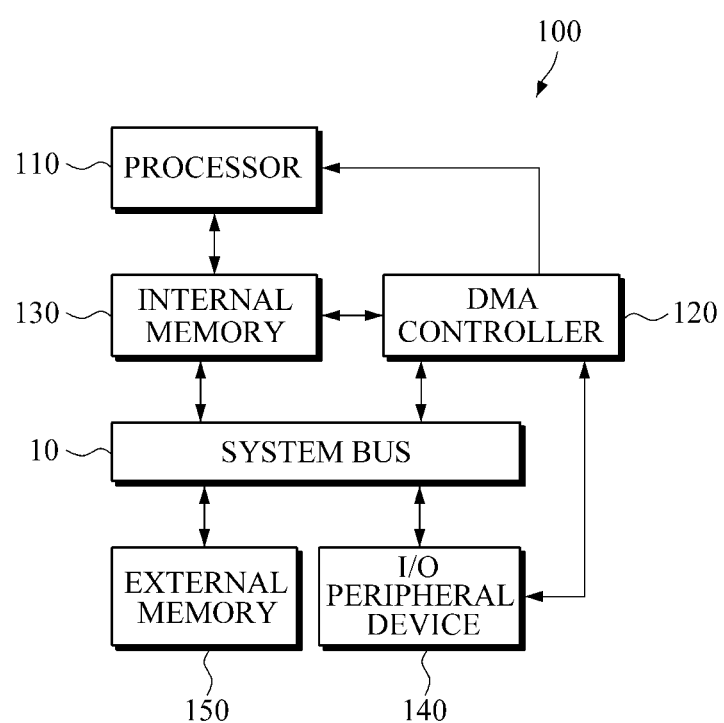
FIG. 1 is a diagram illustrating an example of a system which utilizes a Direct Memory Access (DMA) controller.

Throughout the drawings and the detailed description, unless otherwise described, the is same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

FIG. 1 is a diagram illustrating an example of a system 100 which utilizes a Direct Memory Access (DMA) controller 120.

Referring to FIG. 1, the system 100 may include a processor 110, the DMA controller 120, an internal memory 130, an I/O peripheral device 140, an external memory 150 and a system bus 10. However, the configuration of the system 100 illustrated in FIG. 1 is not limited to these components. The internal memory 130 may be a stretch pad memory, a cache, or a register. The external memory 150 may be one of various storages including a SDRAM, a hard disk, a ROM, and the like. The system 100 may be implemented as one of various data processors including a video processor, an audio processor, a communication processor, a data storage, and the like, and may be configured to include various components.

In FIG. 1, the DMA controller 120 may be in charge of DMA transmission between devices connected to the system bus 10, such as the internal memory 130, the I/O peripheral device 140, and the external memory 150. The DMA controller 120 may be configured to perform pattern (or pattern value) search during data transmission in order to reduce a total is operating time of the system 100. Conventionally, such pattern search has been performed by an external device (for example, by a processor) after data transmission. Here, the pattern may be a certain value, for example, a certain length of data bits. Information to be represented by the pattern may depend on the type of the data, etc.

For example, if the system 100 is a H.264-based video processor, the system 100 may need, when decoding video data, a process of searching for locations at which image frames are identified, or more generally, a process of searching for an address of final data belonging to each frame. In order to search for the identification locations of image frames, the video data may include, when it is encoded, a pre-defined value of every frame boundary. Such a pre-defined value is an example of the pattern value.

The processor 110 may identify, when decoding the encoded video data, the pattern value to extract frames from the video data. It is assumed that the video data is transferred from the external memory 150 to the internal memory 130 so that the processor 110 may access the internal memory 130 to decode the video data. The DMA controller 120 generally performs only the function of transferring the video data, and accordingly in order for the processor 110 to search for information for frame identification from the video data while decoding the video data, an additional process of continuing to compare the video data being processed to predetermined information used in frame identification and storing the results of the comparison may be performed.

The DMA controller 120 may perform, when transferring original video data existing in the external memory 150 to the internal memory 130, a pattern search to identify frame boundaries. The DMA controller 120 may compare each piece of the video data to be transferred to a pre-defined pattern value, and store, in response to finding a piece of data matching the pattern value from the video data, an address of the found piece of data in an is internal register of the DMA controller 120.

Thereafter, when the transfer of the video data is complete and information regarding data locations at which image frames are identified is needed, the processor 110 may read address values stored in the DMA controller 120. Accordingly, the conventional process in which the processor 110 repeatedly accesses the internal memory 130 to compare actual data with a pre-defined pattern value may be omitted.

Figure 2:
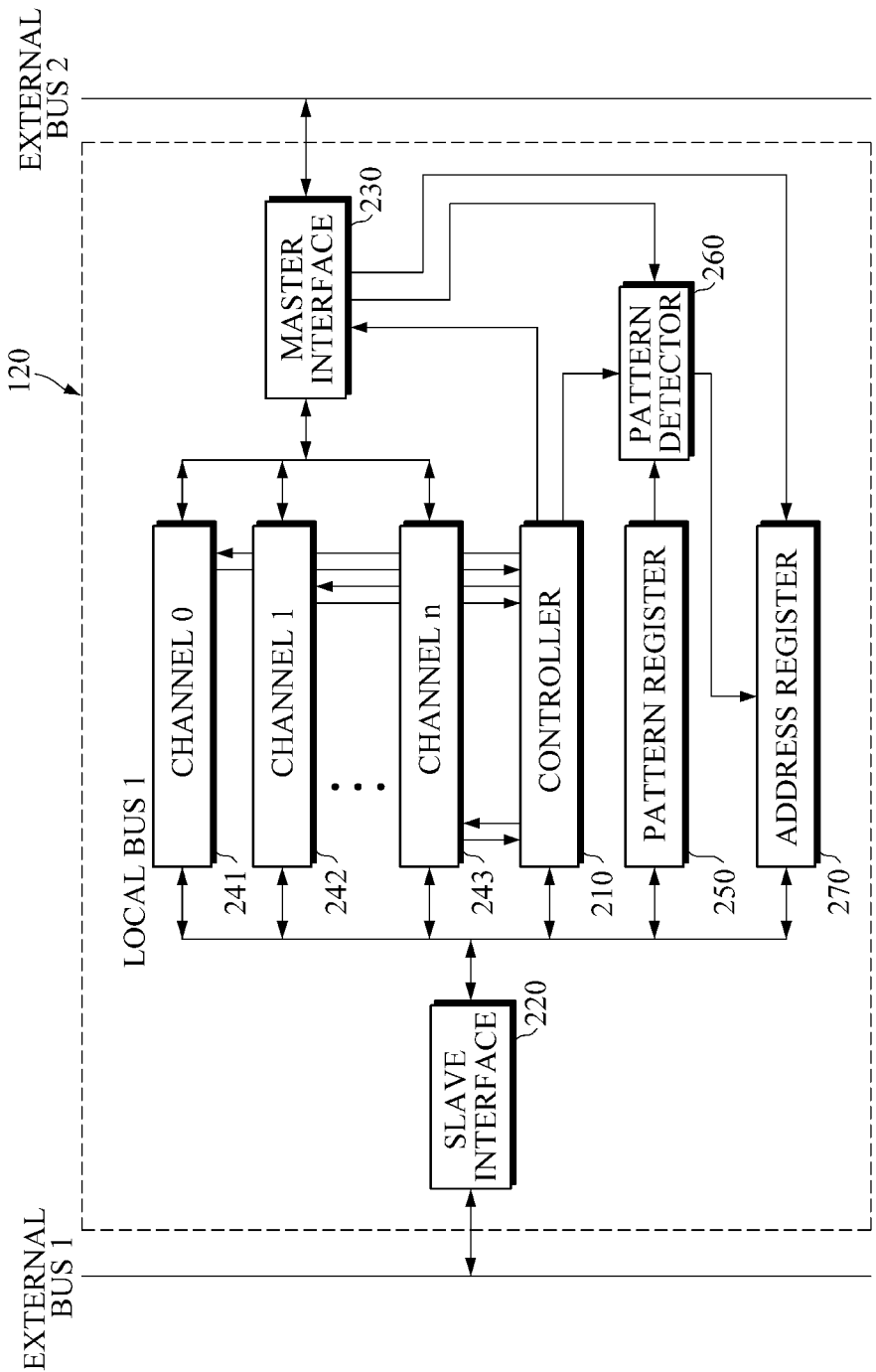
FIG. 2 is a diagram illustrating a configuration example of a DMA controller.

FIG. 2 is a diagram illustrating a configuration example of the DMA controller 120.

Referring to FIG. 2, the DMA controller 120 may include a controller 210, a slave interface 220, a master interface 230, one or more channels 241, 242, . . . 243, a pattern register 250, a pattern detector 260, and an address register 270.

The controller 210 may store settings and state information of the DMA controller 120 and may control the entire operation of the DMA controller 120. The controller 210 may control the master interface 230 and the one or more channels 0, 1, . . . , n (denoted as 241, 242, and 243 in FIG. 2), thereby controlling DMA.

The slave interface 220 is an interface which may allow an external device (generally, the processor 110 of FIG. 1) to control the DMA controller 120 or to acquire state information of the DMA controller 120. One or more slave interfaces 220 may be included in the DMA controller 120. The slave interface 220 may convert signals transmitted through a first external bus 1 and signals transmitted through a first local bus and vice versa. The slave interface 220 may transfer data transmitted through the first external bus 1 to devices connected to the first local bus, that is, to the controller 210, the channels 0, 1, . . . , n (denoted as 241, 242, and 243 in FIG. 2), the pattern register 250, and the address register 270, and data and state information stored in the controller 210, the channels 0, 1, . . . , n (241, 242, and 243 in FIG. 2), the pattern register 250, and the address register 270 to the first external bus 1.

The master interface 230 is a part which may be connected to a device which transmits data directly or via a bus. The master interface 230 may be connected to a second external bus 2 to which a source device (or a first device) and a destination device (or a second device) are connected, and the master interface 230 may perform actual transmission through the second external bus 2 based on information received from the channels 0, 1, . . . , n (241, 242, and 243 in FIG. 2).

The master interface 230 may read data from the source device, temporarily store the read data in a temporary storage of the DMA controller 120, and write the stored data to the destination device. The temporary storage may be installed in the master interface 230, in each of the channels 0, 1, . . . , n (241, 242, and 243 in FIG. 2), or in an internal module of a separate DMA controller 120. Also, a plurality of master interfaces 230 may be provided and in this case, the source device and the destination device may be connected to different external buses.

The one or more channels 0, 1, . . . , n (241, 242, and 243 in FIG. 2) may be in charge of one or more DMA transmissions. One or more of the channels 0, 1, . . . , n (241, 242, and 243 in FIG. 2) may contain information related to transmission and transfer the transmission-related information to the controller 210, the master interface 230, and the slave interface 220. The transmission-related information may include source and destination addresses of data, transmission counters, a transmission method, etc.

The pattern register 250 may store a reference value to be searched for, that is, a pattern value. The pattern register 250 may store additional information (for example, search option information) used to search for the pattern value, as well as the pattern value. A pattern value transferred through the slave interface 220 from an external device of the DMA controller 120, for example, from the processor 110 (see FIG. 1), before DMA transmission, may be stored in the pattern register 250. As an example, data being transmitted may be video data, and the pattern value may be information used to identify a frame boundary from the video data.

The pattern detector 260 may receive the data being transmitted through the master interface 230 and may compare the received data to the pattern value stored in advance in the pattern register 250. The pattern detector 260 may generate, in response to finding, or otherwise determining, the pattern value from the received data, a signal indicating that data matching the pattern value from the received data has been detected, and may transfer the generated signal to the address register 270.

The address register 270 may store an address of the data being transmitted according to the result of the comparison received from the pattern detector 260. Specifically, the address register 270 may receive the address of the data being transmitted from the master interface 230 and store the address of the data in an internal register, in response to the signal generated by the pattern detector 260 indicating that data matching with the pattern value has been detected. The master interface 230 may receive the address of the data from a specific channel, a source device, or a destination device and then may transfer the received address of the data to the address register 270. An external device of the DMA controller 120, for example, the processor 110, may read the address of the data stored in the address register 270 through the slave interface 220, as necessary.

According to an example, the DMA controller 120 may provide a function of searching for a predetermined pattern (or a pattern value) from data being transmitted while performing DMA transmission, thus reducing a total operating time of a system that would otherwise perform such a pattern search. A data processing path used in such a pattern search is not on a data transmission path for DMA, and accordingly such pattern search processing is performed independently from data transmission and as a result does not deteriorate data transmission throughput.

Figure 3:
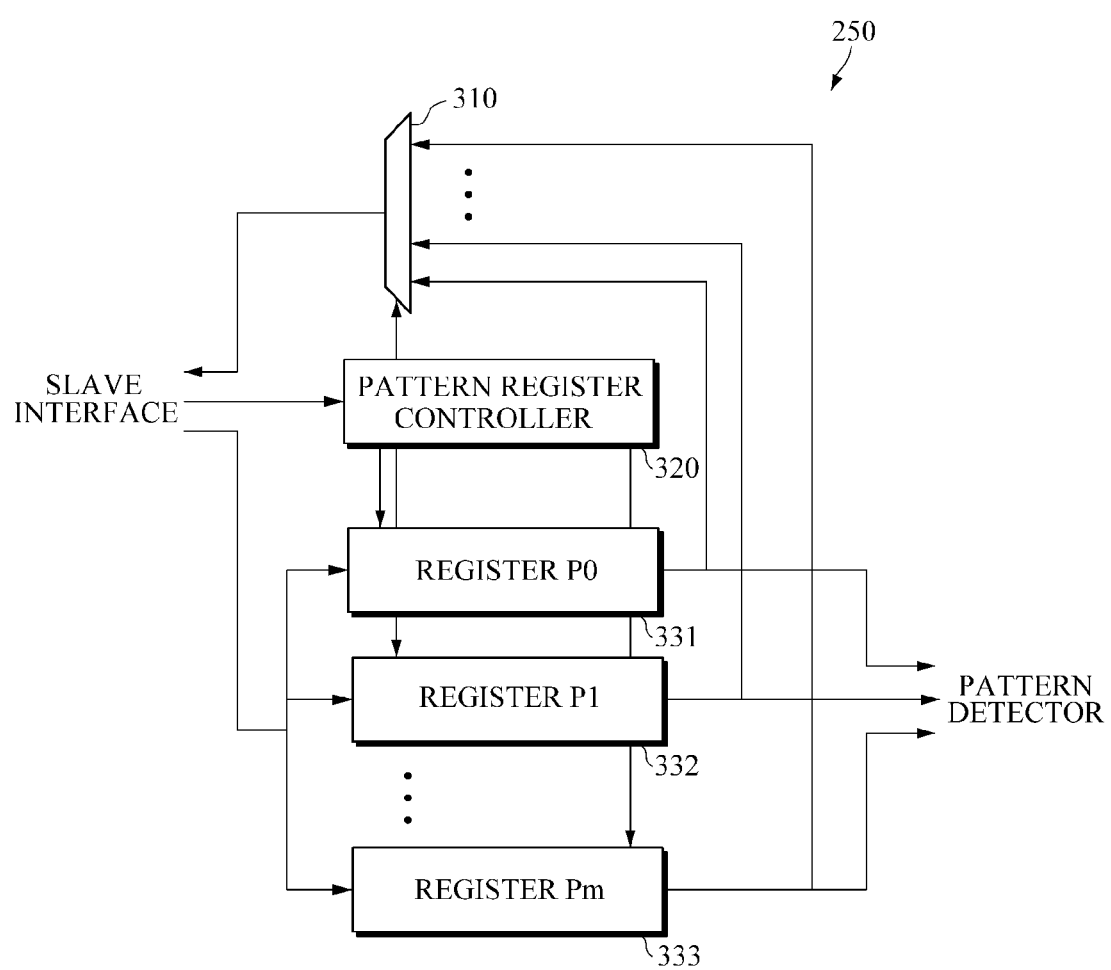
FIG. 3 is a diagram illustrating a configuration example of a pattern register included in the DMA controller of FIG. 2.

FIG. 3 is a diagram illustrating a configuration example of the pattern register 250 included in the DMA controller 120 of FIG. 2.

The pattern register 250 may include a first multiplexer 310, a pattern register controller 320, and one or more registers P0, P1, . . . , Pm (denoted as 331, 332, and 333 in FIG. 3).

The pattern register controller 320 may control the pattern register 250 to store a pattern value transferred from an external device, generally, the processor 110, in one or more of the registers P0, P1, . . . , Pm (331, 332, and 333 in FIG. 3). The pattern value may be received through the slave interface (220 of FIG. 2).

A pattern value received according to a control signal from the pattern register controller 320 may be stored in a specific one of the registers P0, P1, . . . , Pm (denoted as 331, 332, and 333 in FIG. 3). Pattern values stored in the respective registers P0, P1, . . . , Pm (331, 332, and 333 in FIG. 3) are transferred to the pattern detector (260 of FIG. 2). In order to identify the pattern values, the pattern values stored in the registers P0, P1, . . . , Pm (331, 332, and 333) may also be transferred to the slave interface via the first multiplexer 310.

Values stored in the respective registers P0, P1, . . . , Pm (331, 332, and 333) may be found pattern values or may include additional information to provide various search functions. For example, a part of the registers P0, P1, . . . , Pm (331, 332, and 333) may be used as a mask representing a range of bits to be compared. When no pattern search function is used, the registers P0, P1, . . . , Pm (331, 332, and 333) may be used as normal storages.

Figure 4:
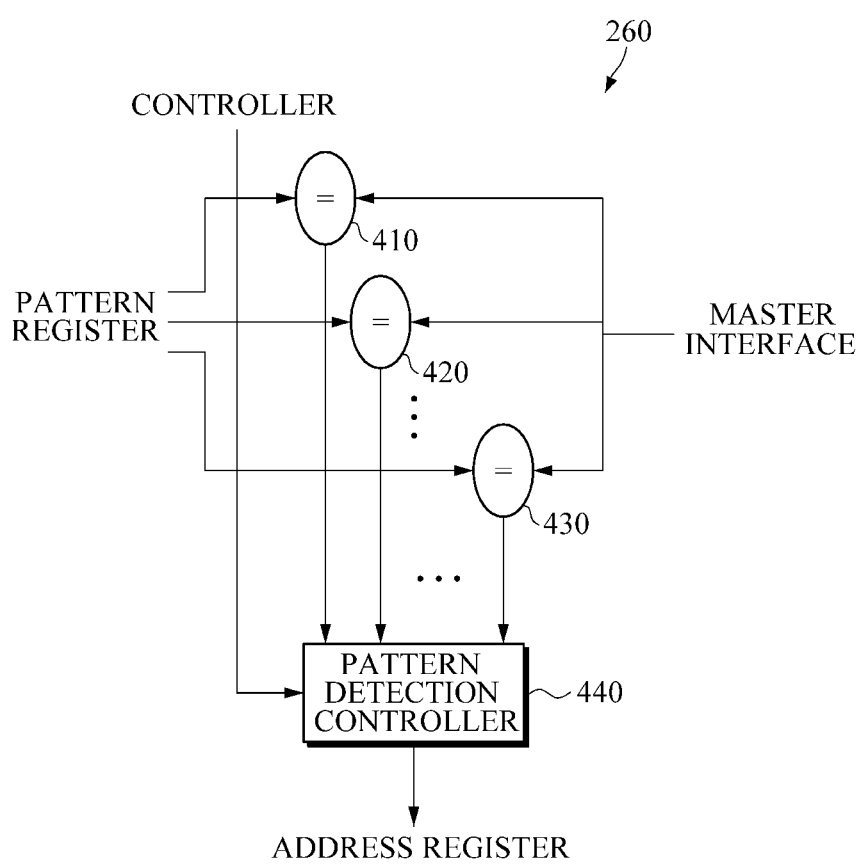
FIG. 4 is a diagram illustrating a configuration example of a pattern detector included in the DMA controller of FIG. 2.

FIG. 4 is a diagram illustrating a configuration example of the pattern detector 260 included in the DMA controller 120 of FIG. 2.

Referring to FIGS. 2 and 4, the pattern detector 260 may include one or more comparators 410, 420, and 430, and a pattern detection controller 440.

The comparators 410, 420, and 430 may compare data being transmitted, which may be is received through the master interface 230, to a value which may be provided by the pattern register 250, and may transfer the results of the comparison to the pattern detection controller 440.

The controller 210 may receive a control signal used to select a specific pattern value from among pattern values provided by the pattern register from an external device, and may provide the control signal to the pattern detection controller 440. In addition, the controller may transfer control information, such as whether or not a pattern search function is used and comparison options capable of affecting the comparison by the comparators 410, 420, and 430, as well as the control signal used to select a specific pattern value, to the pattern detection controller 440. The pattern detection controller 440 may control the operation of the comparators 410, 420, and 430 according to the control information received from the controller.

Also, referring to FIGS. 2 and 4, the pattern detection controller 440 may generate a signal to be transferred to the address register 270, based on the results of the comparison from the respective comparators 410, 420, and 430 and the control signal transferred by the controller 210. In detail, the pattern detection controller 440 may generate, in response to a predetermined pattern value transferred from the pattern register 250 being found from among data being transmitted, a signal indicating that a pattern matching the predetermined pattern value has been found from the data being transmitted, and may transfer the signal to the address register 270.

Figure 5:
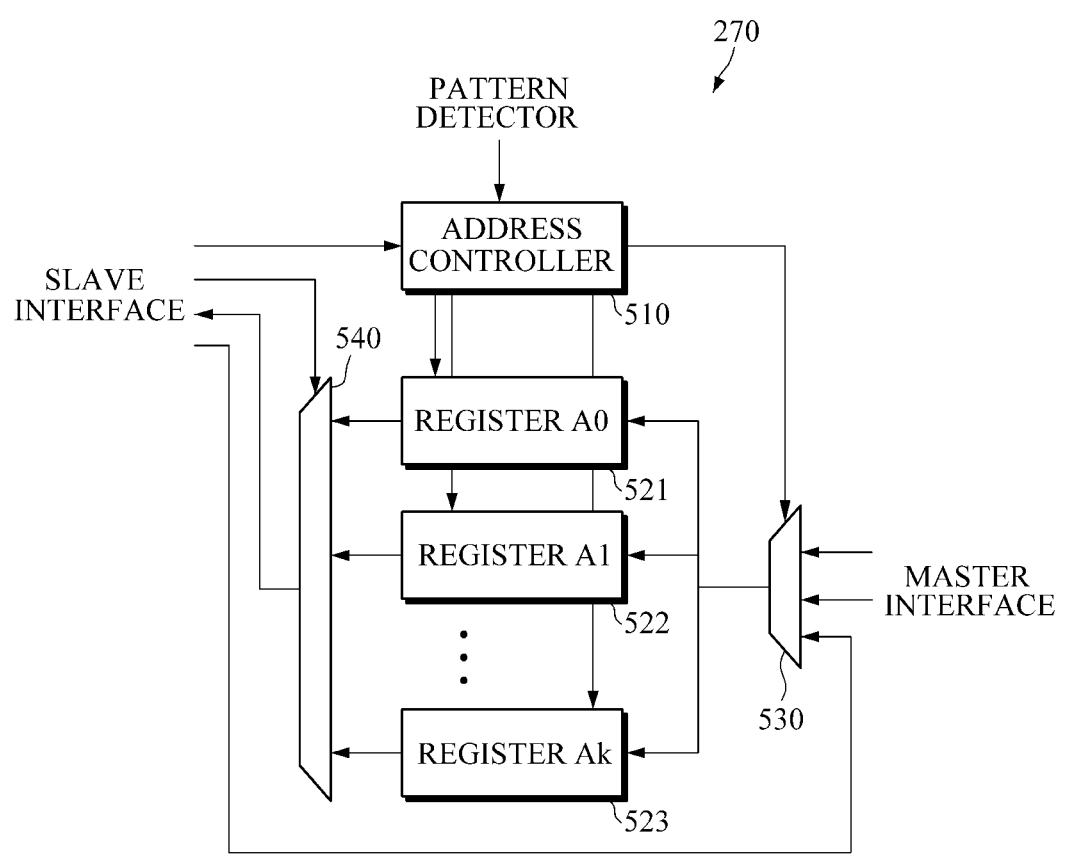
FIG. 5 is a diagram illustrating a configuration example of an address register included in the DMA controller of FIG. 2.

FIG. 5 is a diagram illustrating a configuration example of the address register 270 included in the DMA controller 120 of FIG. 2.

Referring to FIGS. 2 and 5, the address register 270 may include an address controller 510, one or more registers A0, A1, . . . , Ak (denoted as 521, 522, and 523 in FIG. 5) capable of storing addresses of data being transmitted, a second multiplexer 530, and a third multiplexer 540.

Referring to FIGS. 2 and 5, the address controller 510 may store, in response to receiving a signal indicating that a pattern matching a predetermined pattern value has been found from the pattern detection register 260, an address value of data matching a pattern value provided through the master interface 230 in a specific one of the registers A0 through Ak, for example, in the register A0 (521) using the second multiplexer 530.

Thereafter, when an external device, for example, the processor 110 (see FIG. 1) requests an address value of data stored in the specific register, the address value of the data stored in the specific register may be transferred to the processor 110 through the slave interface 220 via the third multiplexer 540, regardless of data transmission by DMA. However, when no pattern search function is used, the address register 270 can be used as a normal storage which stores data received through the slave interface 220.

Figure 6:
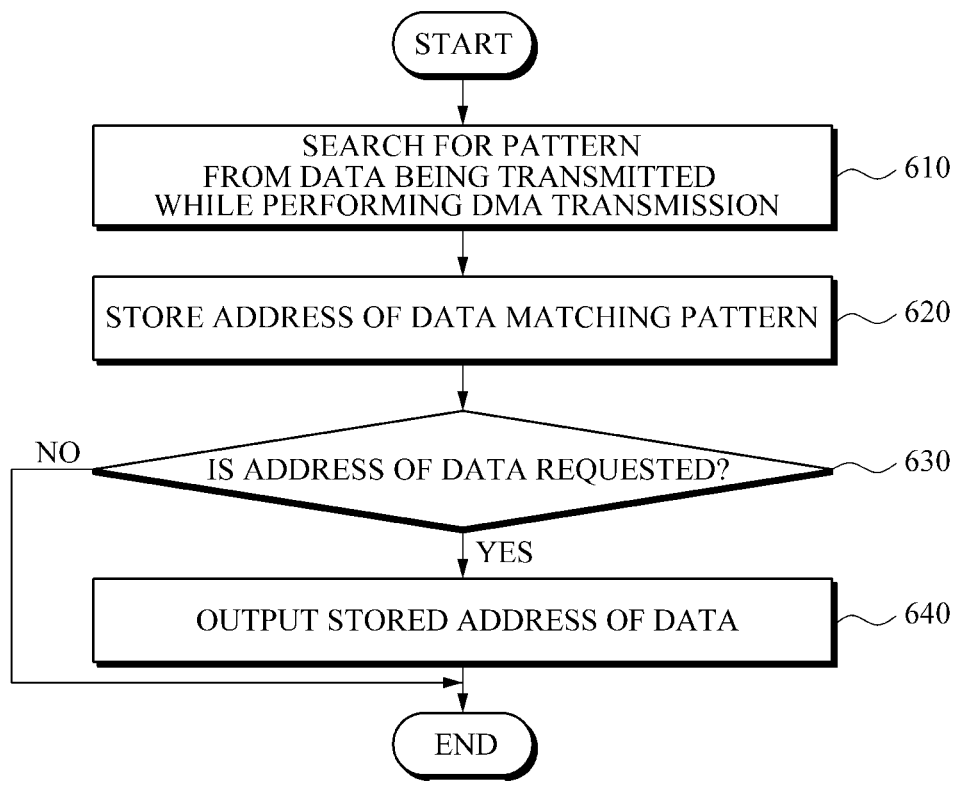
FIG. 6 is a flowchart illustrating an example of a method of operating a DMA controller.

FIG. 6 is a flowchart illustrating an example of a method of operating the DMA controller 120 illustrated in FIGS. 1 and 2.

The DMA controller 120 may transmit data and simultaneously search for a predetermined pattern from the data being transmitted (operation 610). At least one pattern value may be stored in advance in the DMA controller 120. A pattern value to be compared among the at least one pattern value may also be selected in advance. The DMA controller 120 may compare the data being transmitted with a predetermined pattern value, and may generate, when data matching the predetermined pattern value is found, a signal indicating that data matching the predetermined pattern value has been detected.

Also, the DMA controller 120 may store an address of the data matching the predetermined pattern value (operation 620). In more detail, in response to the signal indicating that data matching the predetermined pattern value has been detected being generated, the DMA controller 120 may acquire and store an address of the data matching the pattern value. While operation 620 is performed, data transmission by DMA may be performed.

Regardless of data transmission by DMA, if an external device requests an address of stored data (operation 630), the DMA controller 120 may selectively output an address of data matching a pattern value stored in the internal register to the external device (operation 640).

According to the operation method of the DMA controller 120 described above, an external device can output a location of a predetermined pattern from transmitted data by simply reading an address of data stored in the DMA controller 120, that is, in the address register 270, unlike a conventional method in which after data transmission by DMA, an external device sequentially compares transmitted data with a predetermined pattern used in a pattern search to store an address value of data matching the predetermined pattern and store an address value of data matching the predetermined pattern in advance.

The processes, functions, methods and/or software described above may be recorded, stored, or fixed in one or more computer-readable storage media that includes program instructions to be implemented by a computer to cause a processor to execute or perform the program instructions. The media may also include, alone or in combination with the program instructions, data files, data structures, and the like. The media and program instructions may be those specially designed and constructed, or they may be of the kind well-known and available to those having skill in the computer software arts. Examples of computer-readable media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The described hardware devices may be configured to act as one or more software modules in order to perform the operations and methods described above, or vice versa. In addition, a computer-readable storage medium may be distributed among computer systems connected through a network and computer-readable codes or program instructions may be stored and executed in a decentralized manner.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A Direct Memory Access (DMA) Controller which transmits data from a first device to a second device without passing through a processor, the DMA controller comprising:
    a pattern register configured to store at least one pattern value;
    a pattern detector configured to compare data being transmitted through the DMA controller to the pattern value and to generate, in response to data matching the pattern value being detected from the data being transmitted, a signal indicating that the data matching the pattern value has been detected; and
    an address register configured to store an address of the data matching the pattern value in response to the signal generated by the pattern detector.

2. The DMA controller of claim 1, further comprising a controller configured to control DMA operation,
    wherein a DMA operation is performed simultaneously with operation of the pattern detector.

3. The DMA controller of claim 1, wherein the pattern register comprises:
    at least one register configured to store the at least one pattern value; and
    a pattern register controller configured to store a pattern value received from an external device in the at least one register.

4. The DMA controller of claim 1, wherein the pattern detector comprises:
    a pattern detection controller configured to select a pattern value from the at least one pattern value; and
    at least one comparator configured to compare the selected pattern value with the data being transmitted,
    wherein the pattern detection controller generates, in response to data matching the selected pattern value being detected from the data being transmitted, a signal indicating that the data matching the pattern value has been detected.

5. The DMA controller of claim 4, wherein the controller receives a control signal used in selecting the pattern value from the external device and provides the control signal to the pattern detection controller.

6. The DMA controller of claim 1, wherein the address register comprises:
an address controller to acquire an address of the data matching the pattern value, in response to the signal received from the pattern detector, the signal indicating that the data matching the pattern value has been detected; and
at least one register configured to store the acquired address.

7. The DMA controller of claim 6, wherein the address register further comprises a multiplexer configured to selectively output an address of data stored in the at least one register to an external device, in response to a request from the external device, regardless of data transmission by DMA.

8. The DMA controller of claim 7, wherein the external device is a processor.

9. The DMA controller of claim 1, wherein the data being transmitted is video data and the pattern value is information used in identifying a boundary of a frame from the video data.

10. The DMA controller of claim 1 further comprises a channel configured to transmit the data from the first device to the second device.

11. The DMA controller of claim 1, wherein the address is separate from the data.

12. A method of operating a Direct Memory Access (DMA) controller to transfer data from a first device to a second device without passing through a processor, the method comprising:
transmitting data through the DMA controller;
searching for a pattern value in the data being transmitted while transferring the data; and
storing an address of data matching the pattern value,
wherein the searching of the pattern value from the data being transmitted comprises:
comparing the data being transmitted through the DMA controller to the pattern value; and
generating, in response to data matching the pattern value being detected from the data being transmitted, a signal indicating that the data matching the pattern value has been detected,
wherein the storing of the address of the data matching the pattern value comprises storing an address of the data matching the pattern value in response to the signal indicating that the data matching the pattern value has been detected.

13. The method of claim 12, further comprising, before the comparing of the data being transmitted to the pattern value, storing the at least one pattern value; and
selecting a pattern value from the at least one pattern value to be compared.

14. The method of claim 12, wherein the storing of the address of the data matching the pattern value comprises:
acquiring the address of the data being transmitted in response to the signal indicating that the data matching the pattern value has been detected; and
storing the acquired address.

15. The method of claim 12, further comprising selectively outputting the stored address to the external device, in response to a request from the external device, regardless of data transmission by DMA.

16. The method of claim 12, wherein the data being transmitted is video data and the pattern value is information used in identifying a boundary of a frame from the video data.

17. A method of operating a Direct Memory Access (DMA) controller to transfer data from a first device to a second device without passing through a processor, the method comprising:
detecting a predetermined pattern value in the transferred data;
storing an address of data matching the pattern value; and
searching of the pattern value from the data being transmitted, wherein the searching comprises:
comparing the data being transmitted through the DMA controller to the pattern value, and
generating, in response to data matching the pattern value being detected from the data being transmitted, a signal indicating that the data matching the pattern value has been detected,
wherein the storing of the address of the data matching the pattern value comprises storing an address of the data matching the pattern value in response to the signal indicating that the data matching the pattern value has been detected, and
wherein the data includes at least one frame.

18. A Direct Memory Access (DMA) Controller which transmits data from a first device to a second device without passing through a processor, the DMA controller comprising:
a pattern register configured to store at least one pattern value;
a pattern detector configured to compare data being transmitted through the DMA controller to the pattern value and to generate, in response to data matching the pattern value being detected from the data being transmitted, a signal indicating that the data matching the pattern value has been detected; and
an address register configured to store an address of the data matching the pattern value in response to the signal generated by the pattern detector,
wherein the data includes at least one frame.

* * * * *